(12) United States Patent
Hsiao et al.

(10) Patent No.: US 8,053,847 B2
(45) Date of Patent: *Nov. 8, 2011

(54) METHOD FOR FABRICATING METAL-OXIDE SEMICONDUCTOR TRANSISTORS

(75) Inventors: Tsai-Fu Hsiao, Hsin-Chu (TW); Ching-I Li, Tainan County (TW); Po-Yuan Chen, Kao-Hsiung Hsien (TW); Chun-An Lin, Chiayi County (TW); Hsiang-Ying Wang, Chia-Yi Hsien (TW); Chao-Chun Chen, Kao-Hsiung (TW); Chin-Cheng Chien, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 253 days.

This patent is subject to a terminal disclaimer.

(21) Appl. No.: 12/324,896

(22) Filed: Nov. 28, 2008

(65) Prior Publication Data

US 2009/0101894 A1    Apr. 23, 2009

Related U.S. Application Data

(63) Continuation of application No. 11/675,091, filed on Feb. 15, 2007, now Pat. No. 7,476,303.

(60) Provisional application No. 60/766,954, filed on Feb. 22, 2006.

(51) Int. Cl.
  *H01L 21/02* (2006.01)
(52) U.S. Cl. .. 257/408; 438/305; 438/515; 257/E21.154

(58) Field of Classification Search .................. 438/305, 438/515; 257/408, E21.154
See application file for complete search history.

(56) References Cited

U.S. PATENT DOCUMENTS

| | | | |
|---|---|---|---|
| 5,399,506 | A | 3/1995 | Tsukamoto |
| 5,736,440 | A | 4/1998 | Manning |
| 5,966,605 | A | 10/1999 | Ishida |
| 6,100,171 | A | 8/2000 | Ishida |
| 6,365,476 | B1 | 4/2002 | Talwar |
| 6,380,044 | B1 | 4/2002 | Talwar |
| 6,642,122 | B1 | 11/2003 | Yu |
| 7,473,606 | B2 * | 1/2009 | Hsiao et al. .................. 438/300 |

(Continued)

FOREIGN PATENT DOCUMENTS

| | | |
|---|---|---|
| TW | 200520021 | 6/2005 |
| TW | 200631103 | 9/2006 |

OTHER PUBLICATIONS

L. Mariucci et al., "Mechanisms of dopant redistribution and retention in Silicon following ultra-low energy Boron implantation and excimer laser annealing", Sep. 2002, pp. 595-598, IEEE.

(Continued)

*Primary Examiner* — Trung Dang
(74) *Attorney, Agent, or Firm* — Winston Hsu; Scott Margo

(57) ABSTRACT

A method for fabricating a metal-oxide semiconductor transistor is disclosed. First, a semiconductor substrate having a gate structure thereon is provided, and a spacer is formed around the gate structure. An ion implantation process is performed to implant a molecular cluster containing carbon, boron, and hydrogen into the semiconductor substrate at two sides of the spacer for forming a doped region. The molecular weight of the molecular cluster is preferably greater than 100. Thereafter, a millisecond annealing process is performed to activate the molecular cluster within the doped region.

18 Claims, 8 Drawing Sheets

U.S. PATENT DOCUMENTS

| | | |
|---|---|---|
| 2001/0054699 A1 | 12/2001 | Horsky |
| 2004/0002202 A1 | 1/2004 | Horsky |
| 2005/0255660 A1 | 11/2005 | Lin |
| 2006/0205192 A1 | 9/2006 | Walther |
| 2008/0248636 A1* | 10/2008 | Olander et al. ............... 438/515 |

OTHER PUBLICATIONS

Daisuke Takeuchi et al., "Shallow Junction Formation by Polyatomic Cluster Ion Implantation", Jun. 1996, pp. 772-775, IEEE.

Jiro Matsuo et al., "Cluster Ion Implantation for Shallow Junction Formation", Jun. 1996, pp. 768-771, IEEE.

Toshio Seki et al., "Development of The Large Current Cluster Ion Beam Technology", Sep. 2002, pp. 673-676, IEEE.

John Hautala et al., "Infusion processing solutions for USJ and localized strained-Si using gas cluster ion beams", 2004, pp. 37-45, IEEE.

* cited by examiner

METHOD FOR FABRICATING METAL-OXIDE SEMICONDUCTOR TRANSISTORS

CROSS REFERENCE TO RELATED APPLICATIONS

This is a continuation application of U.S. patent application Ser. No. 11/675,091, filed on Feb. 15, 2007, which claims the benefit of provisional Application No. 60/766,954, filed on Feb. 22, 2006, and all benefits of such earlier application are hereby claimed for this new continuation application.

BACKGROUND OF THE INVENTION

1. Field of the Invention

The invention relates to a method for fabrication metal-oxide semiconductor transistors.

2. Description of the Prior Art

With progress in the semiconductor industry, performance and economic factors of integrated circuit design and manufacture have caused a scale of devices in integrated circuits to be drastically reduced to miniaturized sizes, increasing density on a chip. However, a short channel effect, which results in a poor threshold voltage roll-off characteristic, always accompanies miniaturization. To avoid this problem, industries have provided a method for forming lightly doped drains (LDDs) having an ultra shallow junction as a solution.

In a conventional ultra shallow junction formation, a low energy ion implantation process is performed in a shallow surface of a substrate adjacent to two sides of a gate structure, a rapid thermal annealing (RTA) process is then performed to form a junction profile. However, as device scale is reduced to 90-nm and smaller, the conventional ultra shallow junction formation hits a limitation in depth control, and co-implantation performed in cooperation with pre-amorphization (PAI) and laser annealing seems to be able to satisfy demands down to 65-nm and even 45-nm processes.

Please refer to FIGS. 1-3. FIGS. 1-3 illustrate a method of utilizing pre-amorphized implantation process for fabricating a p-type metal-oxide semiconductor (PMOS) transistor having ultra-shallow junction according to the prior art. As shown in FIG. 1, a semiconductor substrate 100 having a gate structure 102 thereon is provided, in which the semiconductor substrate 100 can be a semiconductor wafer or a silicon on insulator substrate. The gate structure 102 includes a gate dielectric 104 and a gate 106 disposed on the gate dielectric 104. Next, a pre-amorphized implantation process is conducted by injecting atoms such as antimony (Sb) or germanium (Ge) into the semiconductor substrate 100. The pre-amorphized implantation specifically disrupts the lattice structure of the semiconductor substrate 100 and forms an amorphorized region 108 in the semiconductor substrate 100.

Next, as shown in FIG. 2, an ion implantation process is performed by implanting a p-type dopant such as boron (B) or boron fluoride ($BF_2$) into the semiconductor substrate 100 at two sides of the gate structure 102. A rapid thermal annealing process is conducted thereafter to form a lightly doped drain 110 having ultra-shallow junction of a PMOS transistor.

As shown in FIG. 3, a spacer 112 is formed on the sidewall of the gate structure 102. Next, another ion implantation process is performed to inject a p-type dopant with higher concentration into the semiconductor substrate 100 at two sides of the spacer 112. The p-type dopant can be the aforementioned boron or boron fluoride. Another rapid thermal annealing process is performed thereafter by using a temperature between 950 degrees to 1000 degrees to activate the dopants and form a source/drain region 114 in the semiconductor substrate 114.

It should be noted that despite the fact that the conventional pre-amorphized implantation process can be conducted to achieve ultra-shallow junctions by injecting non-doping ions for inhibiting the diffusion of dopants implanted thereafter, the implantation process also creates significant interstitial defects while using the implanted ions to damage the lattice structure of the silicon substrate. Specifically, the interstitial defects become diffusion paths for dopants such as boron and ultimately causes a transient enhanced diffusion effect. This transient enhanced diffusion effect not only deepens the junction profile but also makes the distribution of the dopant not sheer in the lateral direction, resulting in an end of range dislocation phenomenon and a severe short channel effect.

SUMMARY OF THE INVENTION

It is an objective of the present invention to provide a method for fabricating a metal-oxide semiconductor transistor for solving the aforementioned problems.

A method for fabricating a metal-oxide semiconductor transistor is disclosed. First, a semiconductor substrate having a gate structure thereon is provided, and a spacer is formed around the gate structure. An ion implantation process is performed to implant a molecular cluster containing boron into the semiconductor substrate at two sides of the spacer for forming a source/drain region. The weight ratio of each boron atom within the molecular cluster is preferably less than 10%. Thereafter, a millisecond annealing process is performed to activate the molecular cluster within the source/drain region.

The present invention specifically implants a molecular cluster containing boron into the semiconductor substrate for forming an ultra-shallow junction while eliminating the needs of performing any pre-amorphorized implantation. According to the preferred embodiment of the present invention, the implanted molecular cluster is preferably composed of molecules having large molecular weight, such as $B_{10}H_{14}$ or $B_{18}H_{22}$, in which the weight ratio of each boron atom within the molecular cluster is preferably less than 10%. Thereafter, a millisecond annealing process can be conducted to activate the implanted molecular cluster. By eliminating the needs of conducting any pre-amorphized implantation process while forming ultra-shallow junctions, the present invention is able to prevent various drawbacks caused by the pre-amorphized implantation process, including interstitial defects generated by the impact of dopants injected into the lattice structure of the silicon substrate, transient enhanced diffusion caused by rapid boron diffusion during a rapid thermal annealing process, or end of range dislocation phenomenon.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
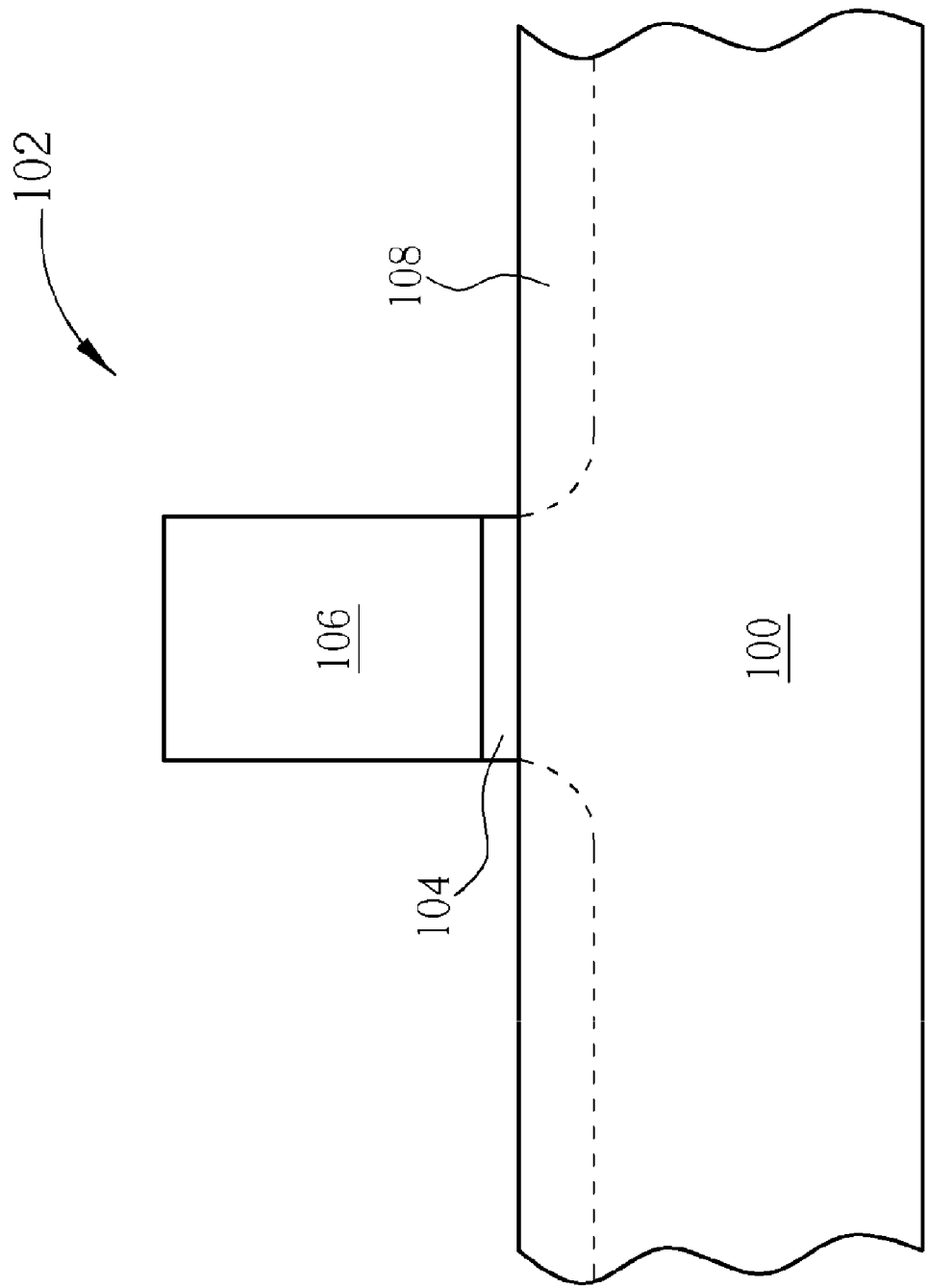
FIGS. 1-3 illustrate a method of utilizing pre-amorphorized implantation process for fabricating a p-type metal-oxide semiconductor (PMOS) transistor having ultra-shallow junction according to the prior art.
Figure 2:
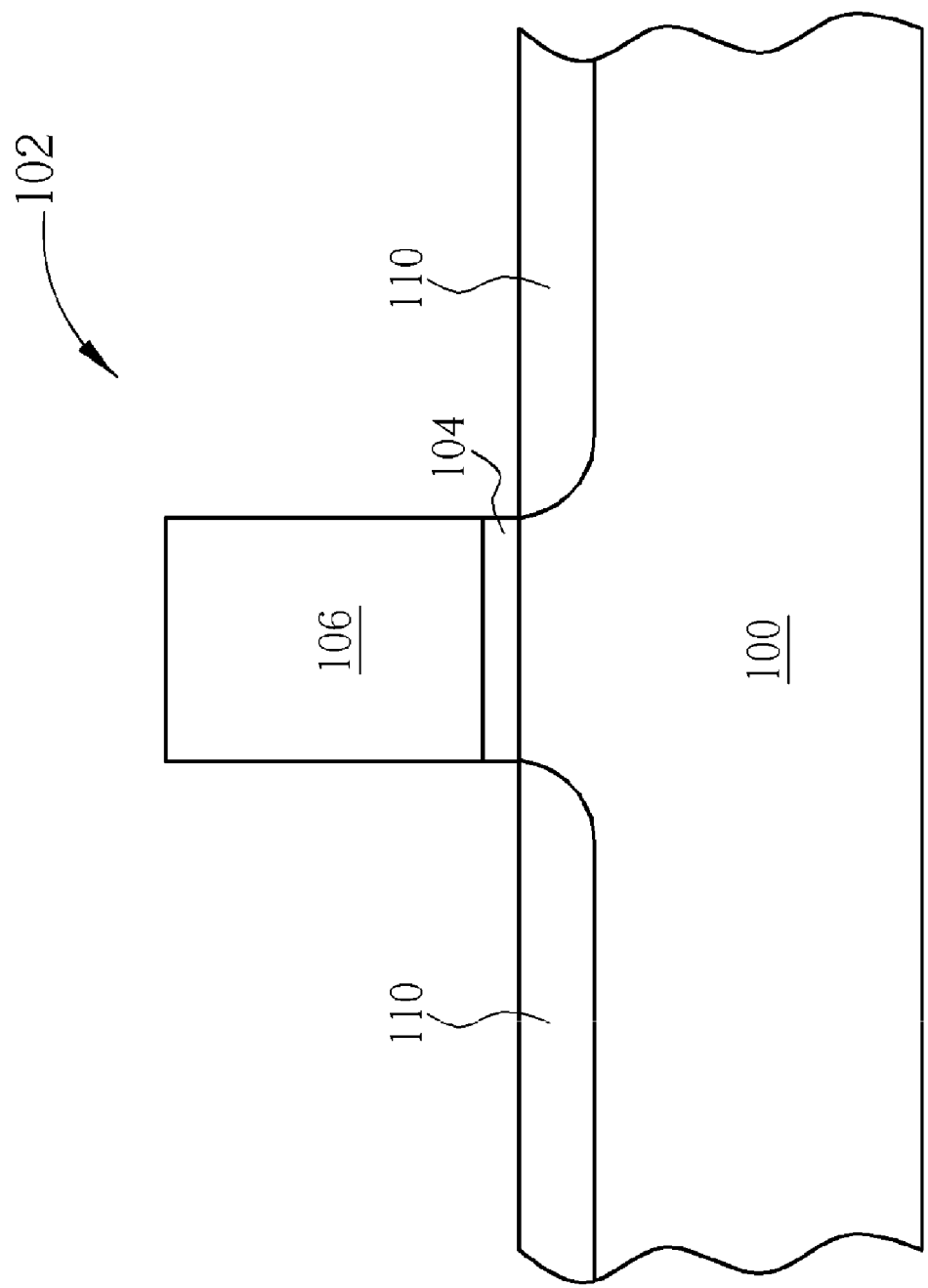
Figure 3:
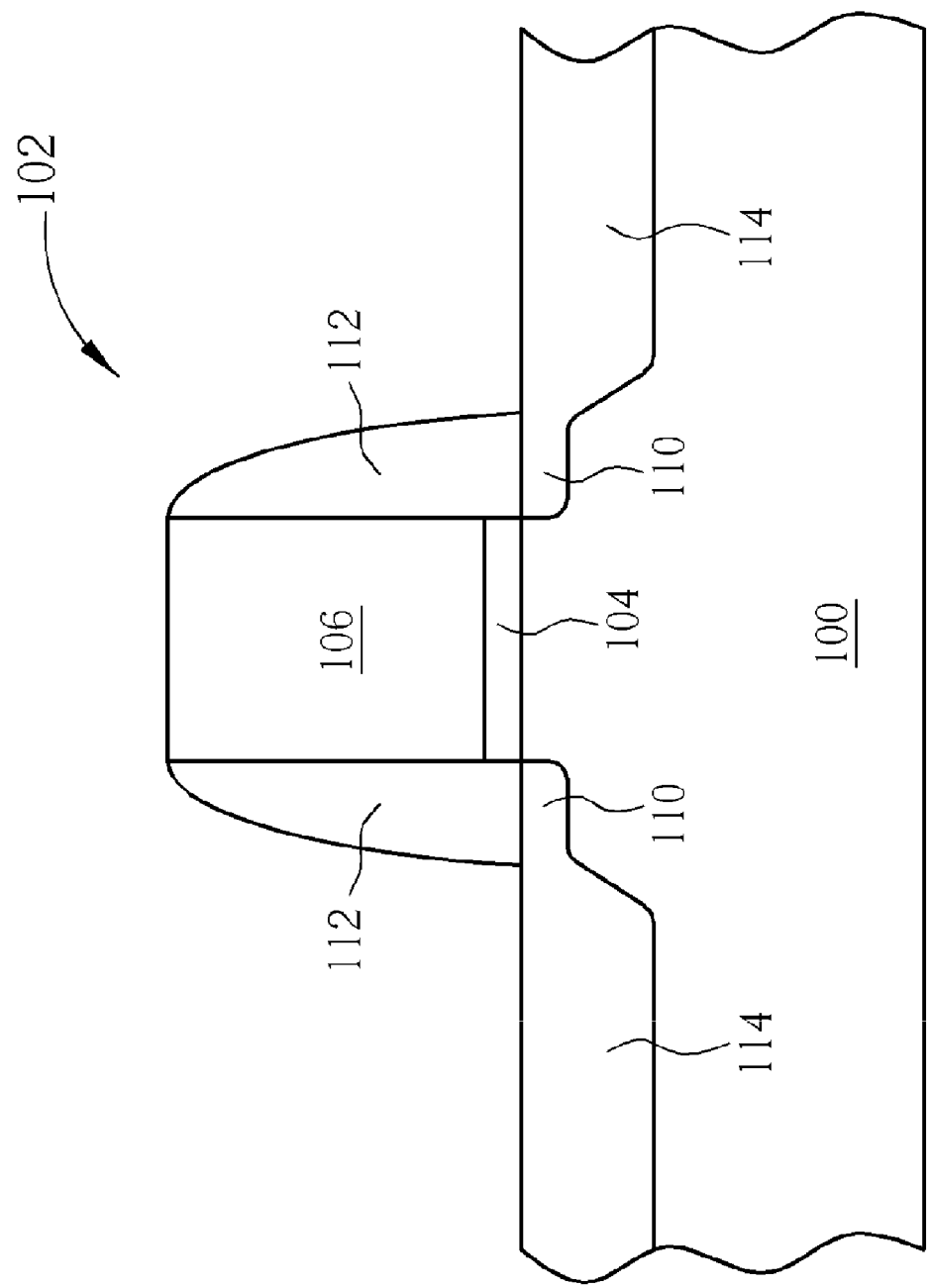
Figure 4:
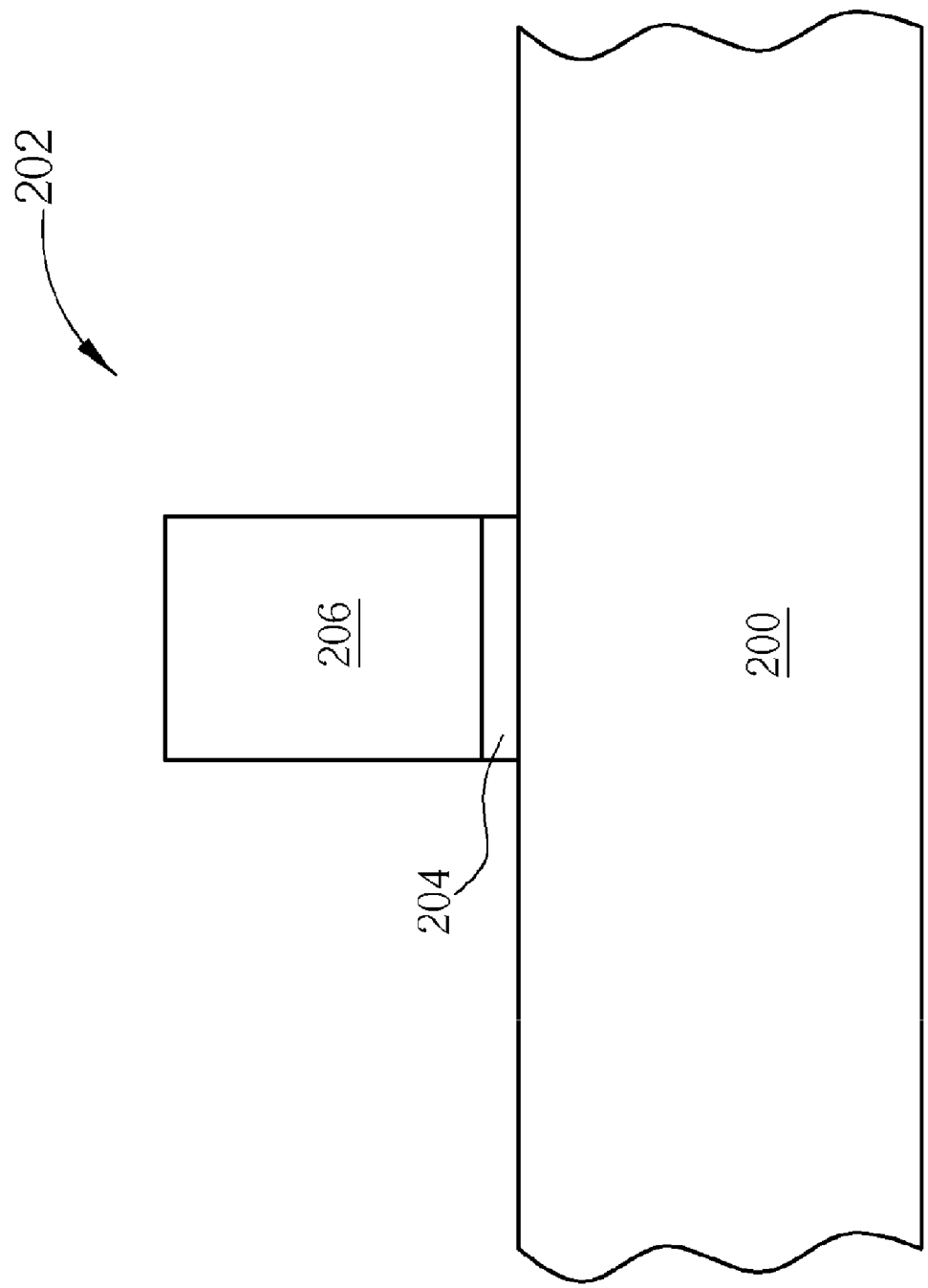
FIGS. 4-6 illustrate a method for fabricating a PMOS transistor according to the preferred embodiment of the present invention.
Figure 5:
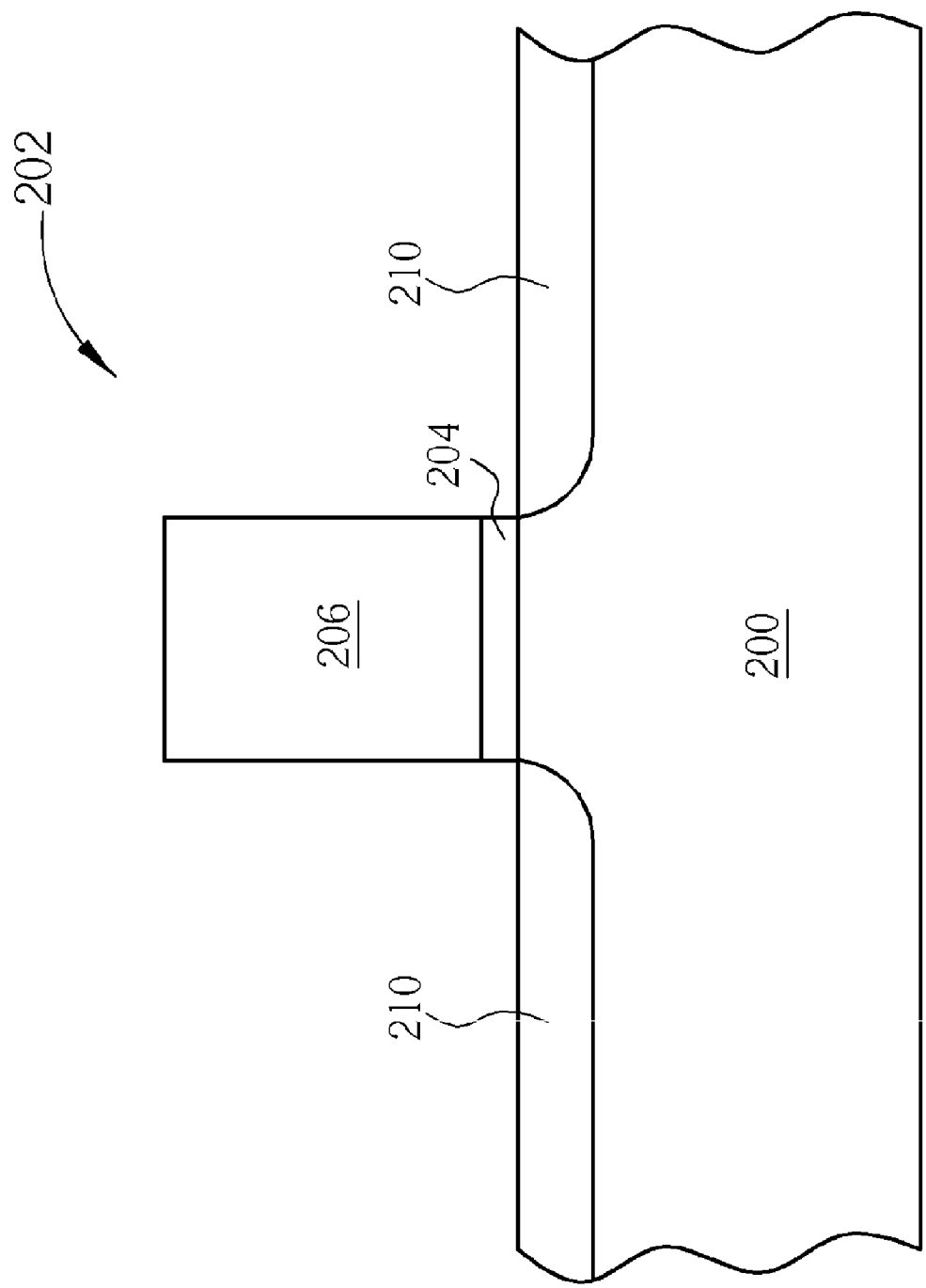
Figure 6:
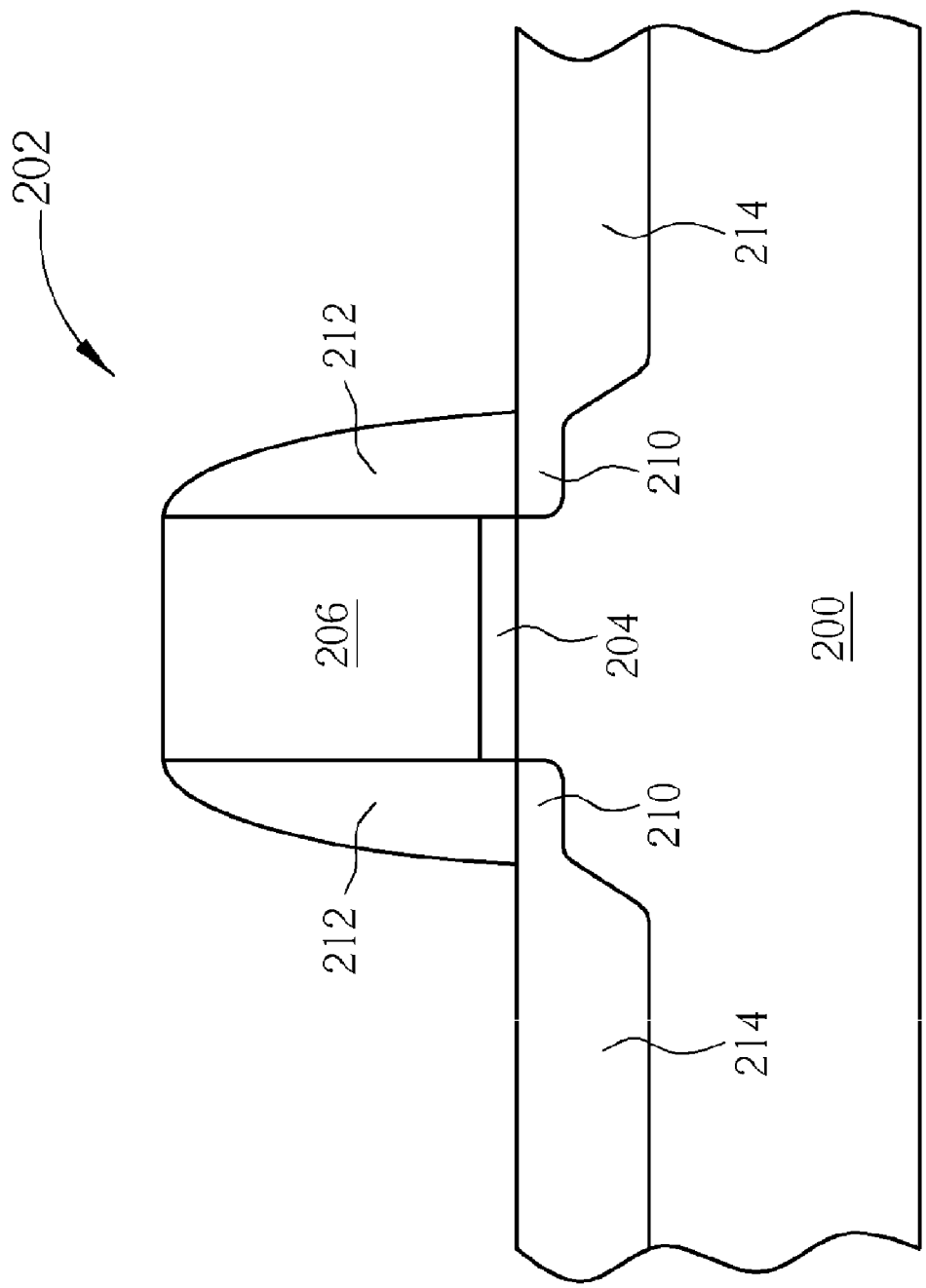

Please refer to FIGS. 4-6. FIGS. 4-6 illustrate a method for fabricating a PMOS transistor according to the preferred embodiment of the present invention. As shown in FIG. 4, a semiconductor substrate 200 having a gate structure 202 thereon is provided, in which the semiconductor substrate 200 can be a semiconductor wafer or a silicon on insulator substrate. The gate structure 202 includes a gate dielectric 204 and a gate 206 disposed on the gate dielectric 204. The gate dielectric 204 is preferably composed of insulating materials such as silicon dioxide and the gate 206 is composed of conductive materials such as doped polysilicon.

As shown in FIG. 5, an ion implantation process is performed by injecting large molecular ions or clustered ions having p-type dopants into the semiconductor substrate 200 at two sides of the gate structure 204 to form a lightly doped drain 210. Preferably, the molecular ions can be a molecular cluster having boron therein. According to the preferred embodiment of the present invention, the molecular cluster injected into the substrate includes $B_xH_y$ and $C_xB_yH_z$. Specifically, $B_xH_y$ can be $B_{10}H_{14}$ or $B_{18}H_{22}$ and the weight ratio of each boron atom within $B_xH_y$ is less than 10%. According to an embodiment of the present invention, the molecular weight of the molecular cluster is greater than 100.

Next, as shown in FIG. 6, a spacer 212 is formed around the gate structure 202. Another ion implantation process is conducted thereafter by injecting a molecular cluster having boron therein into the semiconductor substrate 200 at two sides of the spacer 212. This ion implantation process specifically forms a source/drain region 214 around the lightly doped drain 210. According to the aforementioned composition of the injected dopants, the molecular weight of the molecular cluster is greater than 100, in which the molecular cluster injected into the substrate includes $B_xH_y$ and $C_xB_yH_z$. Preferably, $B_xH_y$ can be $B_{10}H_{14}$ or $B_{18}H_{22}$ and the weight ratio of each boron atom within $B_xH_y$ is less than 10%.

It should be noted that the present invention specifically implants a molecular cluster having significantly large molecular weight into the semiconductor substrate for forming the lightly doped drain and the source/drain region. The injected molecular cluster preferably has boron therein and includes a molecular weight of 100 or above. According to the preferred embodiment of the present invention, the weight ratio of each boron atom within the molecular cluster is less than 10%. Since the weight ratio of each boron atom within the molecular cluster is significantly less than the weight ratio of each boron atom within the conventional dopants, each boron atom of the present invention would have a much smaller energy distribution during the implantation process, thus forming a much shallower junction.

In other words, the present invention aims to provide a method for fabricating ultra-shallow junctions. Preferably, the process for fabrication ultra-shallow junctions can be achieved by implanting a molecular cluster having large molecular weight into the semiconductor substrate without conducting any pre-amorphized implantation process. By eliminating the needs for conducting a pre-amorphized implantation process, the present invention thus prevents various drawbacks caused by the pre-amorphized implantation, such as generating significant interstitial defects, transient enhanced diffusion, or end of range dislocation phenomenon.

After the formation of the source/drain region, a millisecond annealing process can be performed by using a temperature between 1100 degrees to 1500 degrees to activate the molecular cluster within the source/drain region. According to the preferred embodiment of the present invention, the millisecond annealing process can be a laser annealing process or a flash annealing process, in which the duration of the millisecond annealing process is between 100 milliseconds to 1 microsecond.

Figure 7:
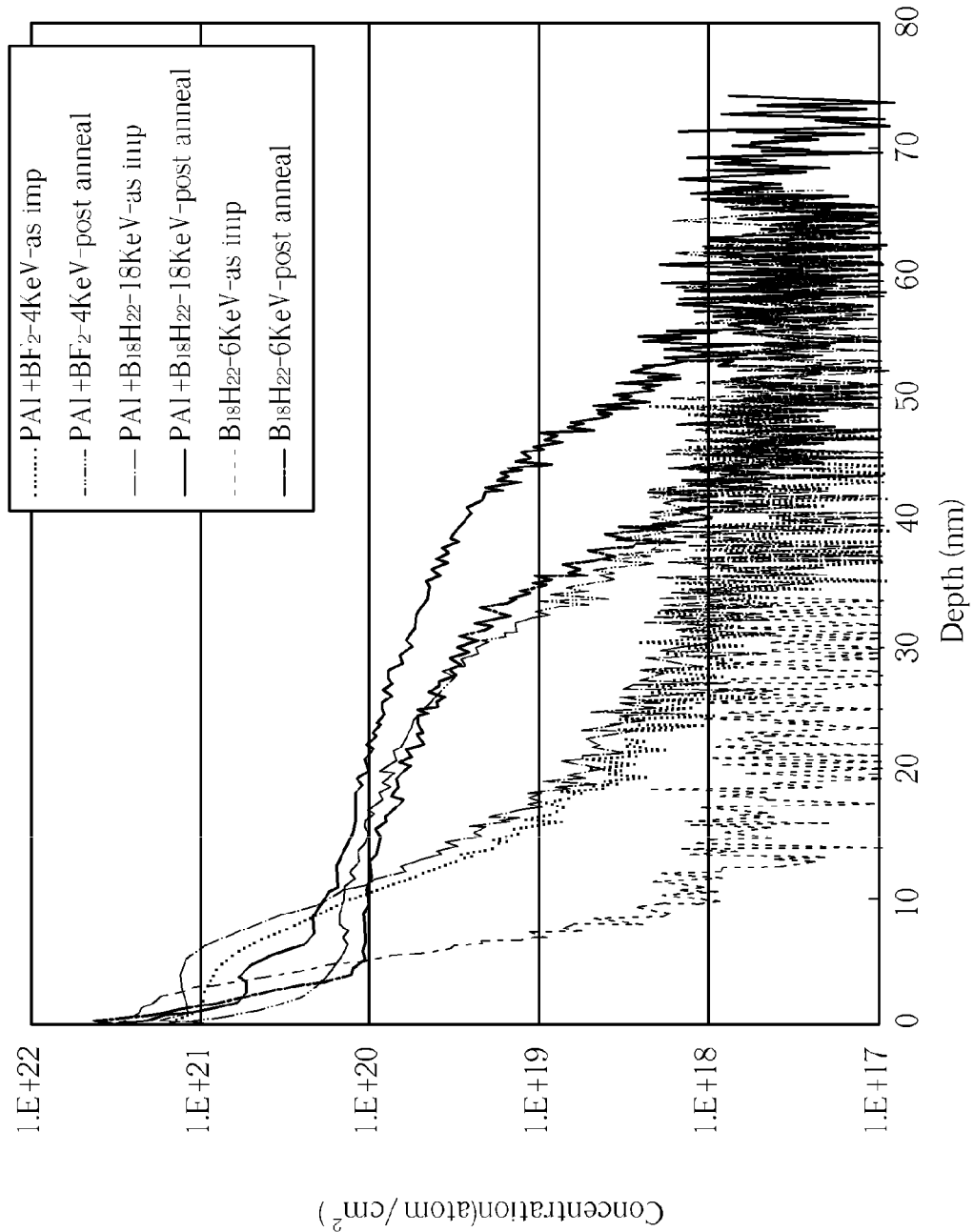
FIG. 7 illustrates the relative junction depth and dopant concentration measured while using dopants of different molecular weight and different fabrication parameters for fabricating ultra-shallow junctions according to the present invention.

Please refer to FIG. 7. FIG. 7 illustrates the junction depth and dopant concentration while using dopants of different molecular weight and different fabrication parameters for fabricating ultra-shallow junctions according to the present invention. As shown in FIG. 7, after a pre-amorphized implantation process is conducted, a dopant containing boron fluoride ($BF_2$) having smaller molecular weight is implanted into the semiconductor substrate with an implantation energy of 4 KeV, and a rapid thermal annealing process is performed to activate the injected dopant, a junction with depth of approximately 35 nm to 50 nm is formed. By using the present process of injecting a boron-contained molecular cluster having large molecular weight with an implantation energy of 6 KeV into the semiconductor substrate without conducting any pre-amorphized implantation process and performing a rapid thermal annealing process to activate the implanted molecular cluster, a junction with similar depth of approximately 35 nm to 50 nm can be formed.

It should be noted that since the weight ratio of a boron atom within $BF_2$ is approximately 22.15%, the boron atom would distribute energy of 0.886 KeV when $BF_2$ is implanted into the semiconductor substrate with implantation energy of 4 KeV. On the other hand, since the weight ratio of a boron atom within $B_{18}H_{22}$ is approximately 4.99%, the boron atom would distribute energy of 0.299 KeV when $B_{18}H_{22}$ is implanted into the semiconductor substrate with implantation energy of 6 KeV. In other words, by implanting a molecular cluster having a boron weight ratio much smaller than the conventional dopants, thus having a much smaller distributing energy for each boron atom, the present invention is able to form a much shallower junction within the substrate.

By following the aforementioned process, the present invention principally utilizes a molecular cluster having large molecular weight to replace the conventional dopants implanted into the semiconductor substrate while eliminating the needs for conducting any pre-amorphized implantation process. Specifically, the molecular cluster injected into the substrate includes molecules such as $B_{18}H_{22}$, which are utilized for replacing the conventional dopants having smaller molecular weight, such as $BF_2$. After the molecular cluster is implanted into the semiconductor substrate, an ultra-shallow junction can be formed. By using this method, the present invention is able to obtain a junction depth equal to the one achieved by using the conventional pre-amorphized implantation with the combination of the $BF_2$ dopant while preventing various problems brought by the pre-amorphorized implantation process.

Figure 8:
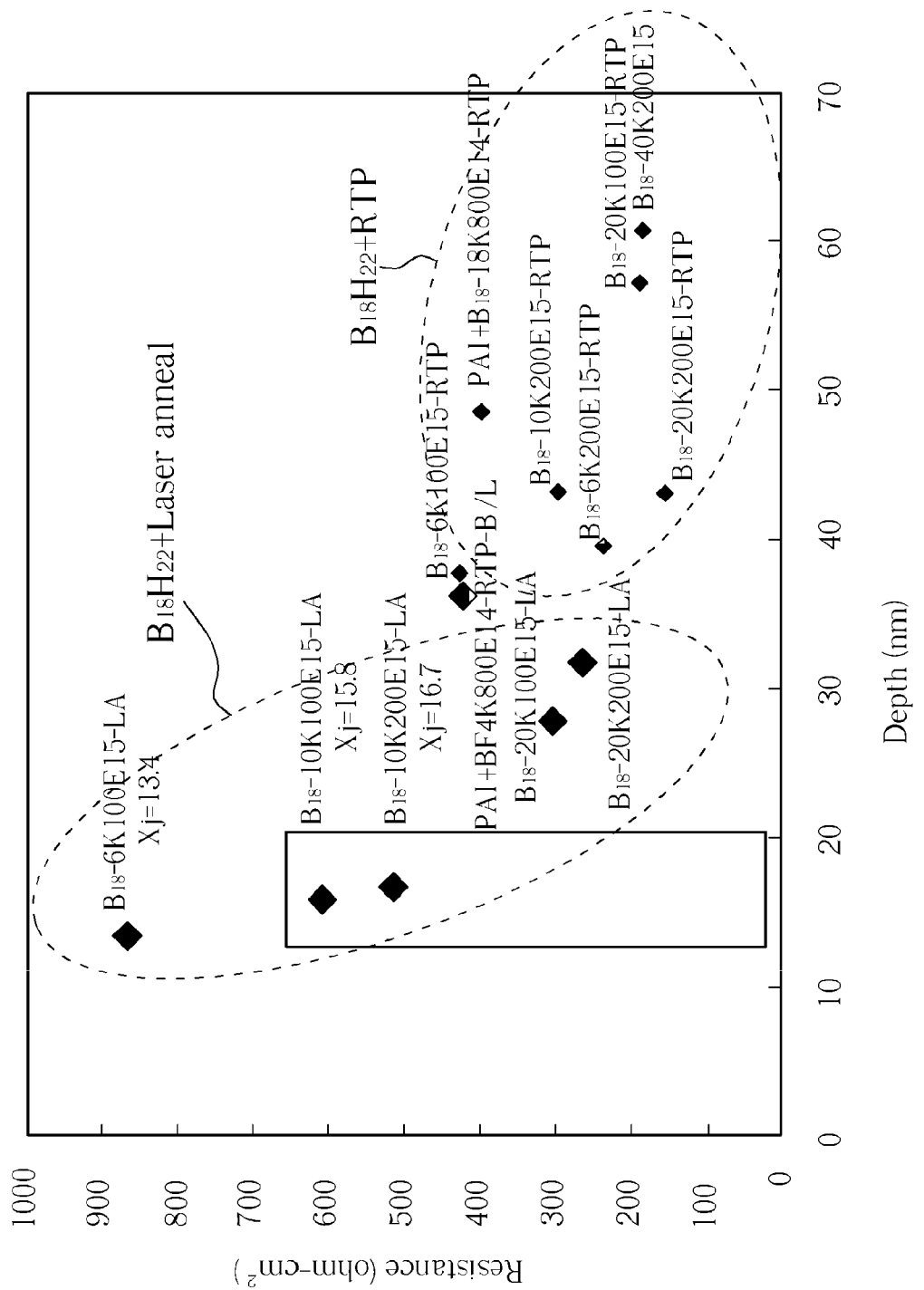
FIG. 8 illustrates the relative resistance and junction depth measured while using either rapid thermal annealing process or laser annealing process for implanting $B_{18}H_{22}$ into a substrate.

Please refer to FIG. 8. FIG. 8 illustrates the relative resistance and junction depth measured while using either rapid thermal annealing process or laser annealing process for implanting $B_{18}H_{22}$ into a substrate. As shown in FIG. 8, when a laser annealing process is performed in combination with the implantation of $B_{18}H_{22}$, a junction shallower than the one achieved from using the rapid thermal annealing process can be obtained. Hence, if the present invention first implants a molecular cluster having large molecular weight, such as $B_{10}H_{14}$ or $B_{18}H_{22}$ into the semiconductor substrate and conducting a millisecond annealing process thereafter to activate the injected molecular cluster, a junction shallower than the one achieved by using the conventional pre-amorphized implantation and $BF_2$ doping can therefore be obtained.

Overall, in contrast to the conventional means of performing a pre-amorphized implantation process with combination of an ion implantation utilizing p-type dopant having relatively smaller molecular weight, the present invention specifically implants a molecular cluster containing boron into the semiconductor substrate for forming an ultra-shallow junction while eliminating the needs of performing any pre-amorphized implantation. According to the preferred embodiment of the present invention, the implanted molecular cluster is composed of molecules having large molecular weight, such as $B_{10}H_{14}$ or $B_{18}H_{22}$, in which the weight ratio of each boron atom within the molecular cluster is less than 10%. Thereafter, a millisecond annealing process can be conducted to activate the implanted molecular cluster. By implanting a molecular cluster having a boron weight ratio much smaller than the conventional dopants, thus having a much smaller distributing energy for each boron atom, the present invention is able to form a much shallower junction within the substrate. Additionally, by eliminating the needs of conducting any pre-amorphized implantation process while forming ultra-shallow junctions, the present invention is able to prevent various drawbacks caused by the pre-amorphized implantation process, including interstitial defects generated by the impact of dopants injected into the lattice structure of the silicon substrate, transient enhanced diffusion caused by rapid boron diffusion during a rapid thermal annealing process, or end of range dislocation phenomenon.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a metal-oxide semiconductor transistor, comprising:
    providing a semiconductor substrate;
    forming a gate structure on the semiconductor substrate;
    forming a spacer around the gate structure;
    performing a first ion implantation process to implant a first molecular cluster having carbon, boron, and hydrogen into the semiconductor substrate at two sides of the spacer for forming a doped region, wherein the molecular weight of the first molecular cluster is greater than 100; and
    performing a millisecond annealing process for activating the first molecular cluster within the doped region.

2. The method for fabricating a metal-oxide semiconductor transistor of claim 1, wherein the doped region comprises a source/drain region.

3. The method for fabricating a metal-oxide semiconductor transistor of claim 2 further comprising performing a second ion implantation process before forming the spacer to implant a second molecular cluster having boron into the semiconductor substrate at two sides of the gate structure for forming a lightly doped drain.

4. The method for fabricating a metal-oxide semiconductor transistor of claim 3, wherein the first molecular cluster and the second molecular cluster comprise $C_xB_yH_z$.

5. The method for fabricating a metal-oxide semiconductor transistor of claim 3, wherein the weight ratio of each boron atom within the first molecular cluster and the second molecular cluster is less than 10%.

6. The method for fabricating a metal-oxide semiconductor transistor of claim 1, wherein the doped region comprises a lightly doped drain.

7. The method for fabricating a metal-oxide semiconductor transistor of claim 6 further comprising performing a second ion implantation process after forming the lightly doped drain to implant a second molecular cluster having boron into the semiconductor substrate at two sides of the spacer for forming a source/drain region.

8. The method for fabricating a metal-oxide semiconductor transistor of claim 7, wherein the first molecular cluster and the second molecular cluster comprise $C_xB_yH_z$.

9. The method for fabricating a metal-oxide semiconductor transistor of claim 7, wherein the weight ratio of each boron atom within the first molecular cluster and the second molecular cluster is less than 10%.

10. A metal-oxide semiconductor transistor, comprising:
    a semiconductor substrate;
    a gate structure disposed on the semiconductor substrate;
    a spacer formed around the gate structure; and
    a doped region formed in the semiconductor substrate, wherein the doped region comprises at least one first molecular cluster having carbon, boron, and hydrogen therein and the molecular weight of the first molecular cluster is greater than 100.

11. The metal-oxide semiconductor transistor of claim 10, wherein the doped region comprises a source/drain region.

12. The metal-oxide semiconductor transistor of claim 11 further comprising a lightly doped drain formed in the semiconductor substrate at two sides of the gate structure, wherein the lightly doped drain comprises at least one second molecular cluster having boron therein.

13. The metal-oxide semiconductor transistor of claim 12, wherein the first molecular cluster and the second molecular cluster comprise $C_xB_yH_z$.

14. The metal-oxide semiconductor transistor of claim 12, wherein weight ratio of each boron atom within the first molecular cluster and the second molecular cluster is less than 10%.

15. The metal-oxide semiconductor transistor of claim 10, wherein the doped region comprises a lightly doped drain.

16. The metal-oxide semiconductor transistor of claim 15 further comprising a source/drain region formed in the semiconductor substrate at two sides of the spacer, wherein the source/drain region comprises at least one second molecular cluster having boron therein.

17. The metal-oxide semiconductor transistor of claim 16, wherein the first molecular cluster and the second molecular cluster comprise $C_xB_yH_z$.

18. The metal-oxide semiconductor transistor of claim 16, wherein weight ratio of each boron atom within the first molecular cluster and the second molecular cluster is less than 10%.

* * * * *

UNITED STATES PATENT AND TRADEMARK OFFICE
CERTIFICATE OF CORRECTION

| | | |
|---|---|---|
| PATENT NO. | : 8,053,847 B2 | Page 1 of 1 |
| APPLICATION NO. | : 12/324896 | |
| DATED | : November 8, 2011 | |
| INVENTOR(S) | : Tsai-Fu Hsiao et al. | |

It is certified that error appears in the above-identified patent and that said Letters Patent is hereby corrected as shown below:

On the title page, item (63), correct the patent number of the Related U.S. Application Data from "7,476,303" to --7,473,606--.

Signed and Sealed this
Third Day of January, 2012

David J. Kappos
*Director of the United States Patent and Trademark Office*